(12) United States Patent
Smith et al.

(10) Patent No.: US 12,626,743 B2
(45) Date of Patent: May 12, 2026

(54) SYSTEMS AND METHODS FOR READING MULTI-BIT MRAM CELLS

(71) Applicant: Veevx, Inc., Mesa, AZ (US)

(72) Inventors: Doug Smith, Mesa, AZ (US); Sushil Sakhare, Mesa, AZ (US)

(73) Assignee: Veevx, Inc., Mesa, AZ (US)

( * ) Notice: Subject to any disclaimer, the term of this patent is extended or adjusted under 35 U.S.C. 154(b) by 121 days.

(21) Appl. No.: 18/453,922

(22) Filed: Aug. 22, 2023

(65) Prior Publication Data

US 2024/0062797 A1 Feb. 22, 2024

Related U.S. Application Data

(60) Provisional application No. 63/373,143, filed on Aug. 22, 2022.

(51) Int. Cl.
*G11C 11/16* (2006.01)
*G11C 11/56* (2006.01)

(52) U.S. Cl.
CPC ........ *G11C 11/1673* (2013.01); *G11C 11/161* (2013.01); *G11C 11/1697* (2013.01); *G11C 11/5607* (2013.01)

(58) Field of Classification Search
CPC .............. G11C 11/1673; G11C 11/161; G11C 11/1697; G11C 11/5607
See application file for complete search history.

(56) References Cited

U.S. PATENT DOCUMENTS

| | | | |
|---|---|---|---|
| 2013/0051114 A1* | 2/2013 | Kim ......................... | G11C 7/08 |
| | | | 365/158 |
| 2016/0240250 A1* | 8/2016 | Oh ......................... | G11C 13/004 |
| 2019/0051338 A1* | 2/2019 | Suzuki ................... | G11C 11/161 |
| 2019/0385676 A1* | 12/2019 | Kuroda ................ | G11C 11/1673 |

\* cited by examiner

*Primary Examiner* — Han Yang
(74) *Attorney, Agent, or Firm* — Polsinelli PC

(57) ABSTRACT
A multi-bit MRAM cell includes at least a first MTJ device storing a first logic bit and a second MTJ device storing a second logic bit. The multi-bit MRAM cell is readable through application of a reference current across the multi-bit MRAM cell and comparison of a resultant output voltage with a plurality of reference voltages.

11 Claims, 8 Drawing Sheets

240 sensing MSB bit

250 sensing LSB bit

Fig.3: Reference current mirror generation

Figure 5:
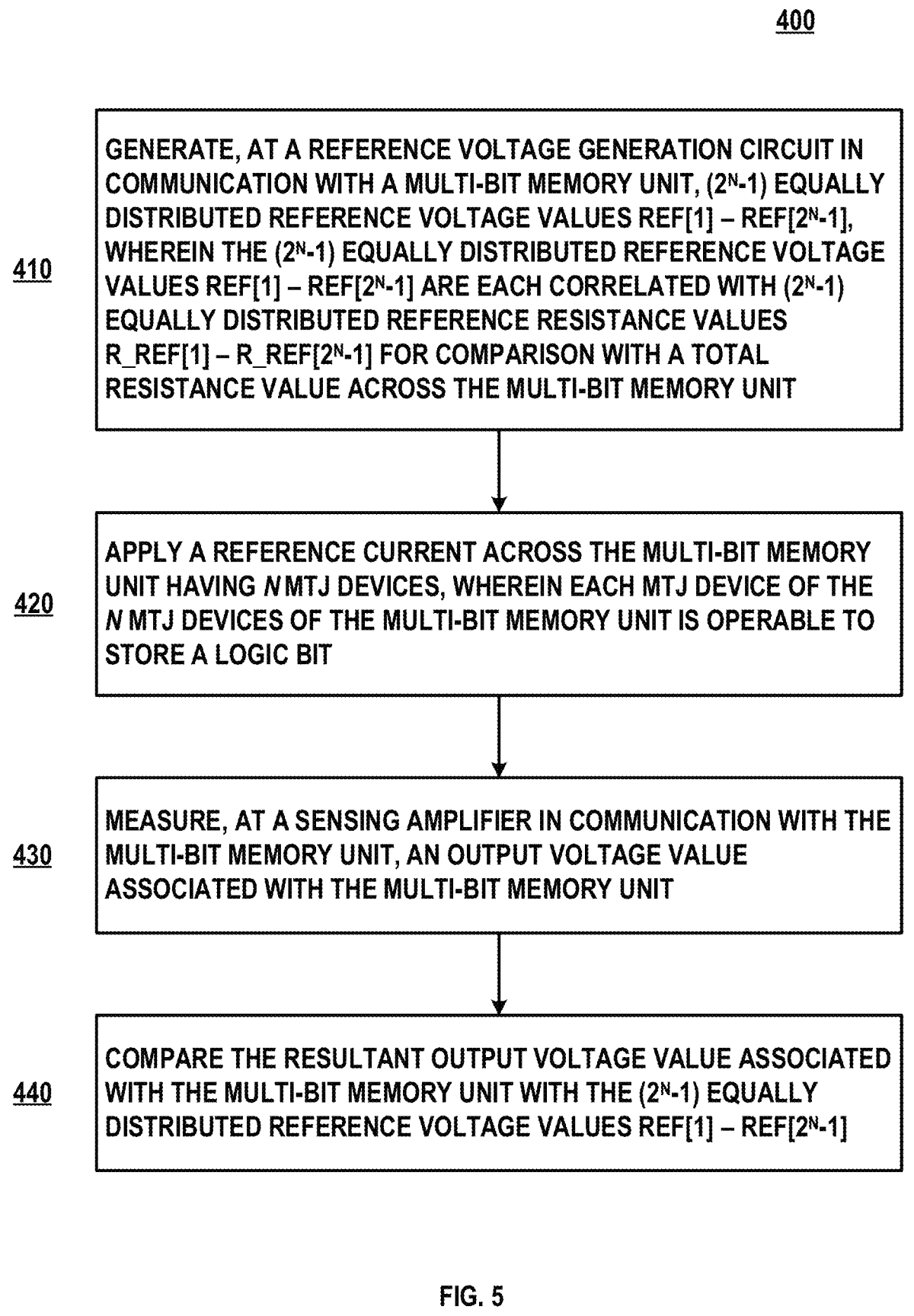

400

GENERATE, AT A REFERENCE VOLTAGE GENERATION CIRCUIT IN COMMUNICATION WITH A MULTI-BIT MEMORY UNIT, $(2^N-1)$ EQUALLY DISTRIBUTED REFERENCE VOLTAGE VALUES REF[1] – REF[$2^N$-1], WHEREIN THE $(2^N-1)$ EQUALLY DISTRIBUTED REFERENCE VOLTAGE VALUES REF[1] – REF[$2^N$-1] ARE EACH CORRELATED WITH $(2^N-1)$ EQUALLY DISTRIBUTED REFERENCE RESISTANCE VALUES R_REF[1] – R_REF[$2^N$-1] FOR COMPARISON WITH A TOTAL RESISTANCE VALUE ACROSS THE MULTI-BIT MEMORY UNIT

410

APPLY A REFERENCE CURRENT ACROSS THE MULTI-BIT MEMORY UNIT HAVING $N$ MTJ DEVICES, WHEREIN EACH MTJ DEVICE OF THE $N$ MTJ DEVICES OF THE MULTI-BIT MEMORY UNIT IS OPERABLE TO STORE A LOGIC BIT

420

MEASURE, AT A SENSING AMPLIFIER IN COMMUNICATION WITH THE MULTI-BIT MEMORY UNIT, AN OUTPUT VOLTAGE VALUE ASSOCIATED WITH THE MULTI-BIT MEMORY UNIT

430

COMPARE THE RESULTANT OUTPUT VOLTAGE VALUE ASSOCIATED WITH THE MULTI-BIT MEMORY UNIT WITH THE $(2^N-1)$ EQUALLY DISTRIBUTED REFERENCE VOLTAGE VALUES REF[1] – REF[$2^N$-1]

SYSTEMS AND METHODS FOR READING MULTI-BIT MRAM CELLS

CROSS REFERENCE TO RELATED APPLICATIONS

This is a non-provisional application that claims benefit to U.S. Provisional Application Ser. No. 63/373,143 filed on Aug. 22, 2022, which is herein incorporated by reference in its entirety.

FIELD

The present disclosure generally relates to digital memory arrays, and in particular, to a system and associated method for reading data values stored in multi-bit MRAM cells.

BACKGROUND

Magnetoresistive random access memory (MRAM) cells traditionally store a single bit at a time in a magnetoresistive tunnel junction (MTJ) device; to read the data stored in a single MRAM cell, a resistance across the MTJ device must be measured. While MTJ devices are remarkably small, electronics manufacturers have incentive to continually reduce size and complexity of MRAM arrays.

It is with these observations in mind, among others, that various aspects of the present disclosure were conceived and developed.

BRIEF DESCRIPTION OF THE DRAWINGS

FIG. 5 is a process flow diagram showing a method of reading the multi-bit MRAM cell of FIGS. 2A-2D.

Corresponding reference characters indicate corresponding elements among the view of the drawings. The headings used in the figures do not limit the scope of the claims.

DETAILED DESCRIPTION

Systems and associated methods for multi-bit magnetoresistive random access memory (MRAM) cells are described herein. In particular, a multi-bit MRAM cell has at least a first magnetic tunnel junction (MTJ) device that stores a first pre-programmed logic value and a second MTJ device that stores a second pre-programmed logic value, although it should be noted that the MRAM cell can include more than two MTJs for storing more than two bits. The value of the multi-bit MRAM cell can be read by comparison with a plurality of reference voltages; the plurality of reference voltages can be locally-generated as will be described in greater detail herein.

MTJ Devices Overview

Figures 1A, 1B, 1C:
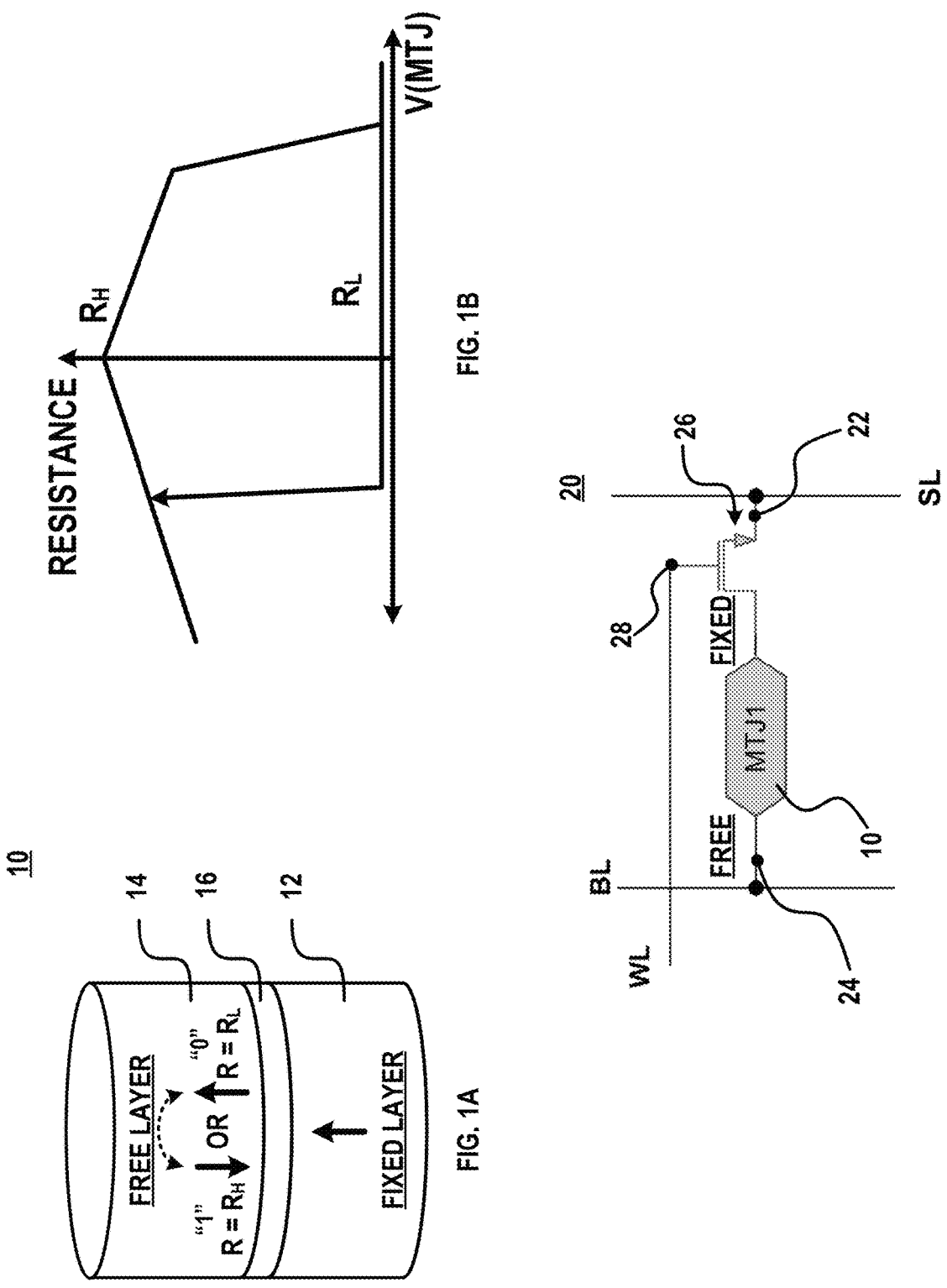
FIG. 1A is a simplified illustration showing a conventional MTJ device capable of holding a single bit, which can include a first logic "HI" value or a second logic "LO" value.
FIG. 1B is a graphical representation showing a transfer curve of the MTJ device of FIG. 1A.
FIG. 1C is a schematic diagram showing a conventional MRAM cell that includes the MTJ device of FIG. 1A.

With reference to FIG. 1A, an MTJ device 10 has a fixed layer 12 having a first magnetic dipole orientation that is fixed (e.g., permanent), a free layer 14 having a second magnetic dipole orientation that is variable between a first direction (e.g., in alignment with the first magnetic dipole orientation) and a second direction (e.g., opposite from the first magnetic dipole orientation), and a barrier layer 16 therebetween. The first magnetic dipole orientation of the fixed layer 12 is always fixed along a first direction, and the second magnetic dipole orientation of the free layer 14 can vary between the first direction and a second direction, where the second direction is opposite to the first direction; the second magnetic dipole orientation of the second "free" layer dictates whether the MTJ device 10 holds a logic "HI" value (e.g., a logic "1") or a logic "LO" value (e.g., a logic "0" value). Typically, the MTJ device 10 stores a logic "HI" value by exhibiting a resistance value within a "high" resistance range RH observed between the fixed layer 12 and the free layer 14 of the MTJ device 10 such that the first magnetic dipole orientation of the fixed layer 12 and the second magnetic dipole orientation of the free layer 14 are opposite from one another. The MTJ device 10 stores a logic "LO" by exhibiting a resistance value within a "low" resistance range $R_L$ observed between the fixed layer 12 and the free layer 14 of the MTJ device 10 such that the first magnetic dipole orientation of the fixed layer 12 and the second magnetic dipole orientation of the free layer 14 are in alignment with one another. The resistance value exhibited by the MTJ device 10 is readable by passing a reference current through the MTJ device 10 and measuring a resultant voltage value across the MTJ device 10. A transfer curve showing variation in resistance values relative to applied voltage across the MTJ device 10 is shown in FIG. 1B.

As shown in FIG. 1C, the MTJ device 10 can be a component of a magnetoresistive cell 20 including a first terminal 22 in electrical communication with a "source" line SL and a second terminal 24 in electrical communication with a "bit" line BL. The fixed layer 12 of the MTJ device 10 is associated with the first terminal 22 and the free layer 14 of the MTJ device 10 is associated with the second terminal 24. The magnetoresistive cell 20 can include an access transistor 26 electrically coupled between the first terminal 22 of the magnetoresistive cell 20 and the fixed layer 12 of the MTJ device 10; the access transistor 26 including a gate terminal 28 that is electrically coupled to a "word" line WL. To initiate a "read" operation of the MTJ device 10, a reference current must be passed through the magnetoresistive cell 20 to measure the resistance across the MTJ device 10. The word line WL must be activated in order to enable the access transistor 26 to transmit current between the source line SL coupled at the first terminal 22 and the bit line BL coupled at the second terminal 24.

Multi-Bit MRAM Cell

Figure 2B:
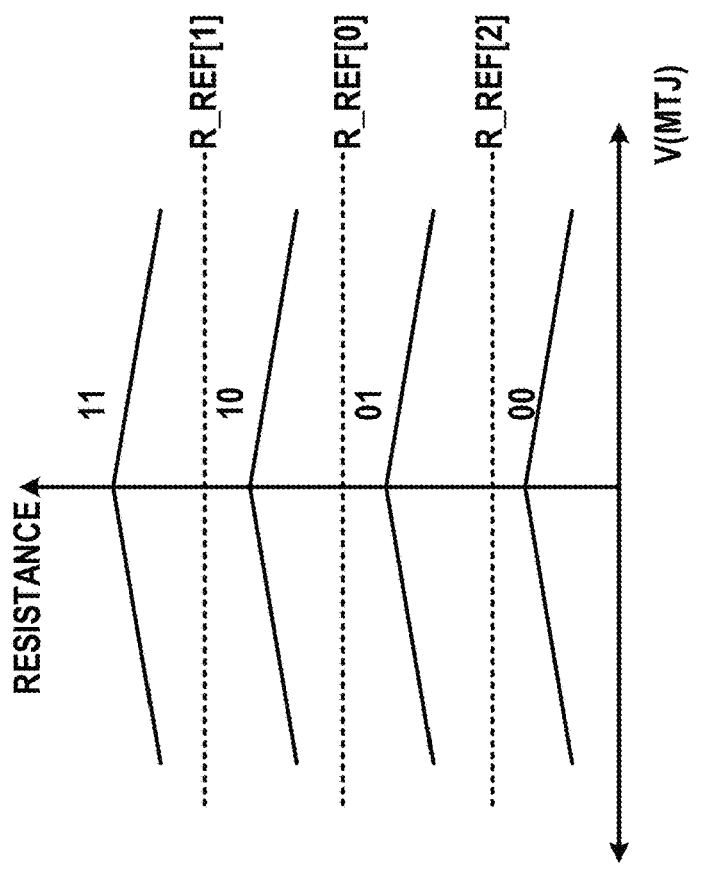
FIG. 2B is a graphical representation showing a transfer curve of the multi-bit MRAM cell FIG. 2A.
Figure 2A:
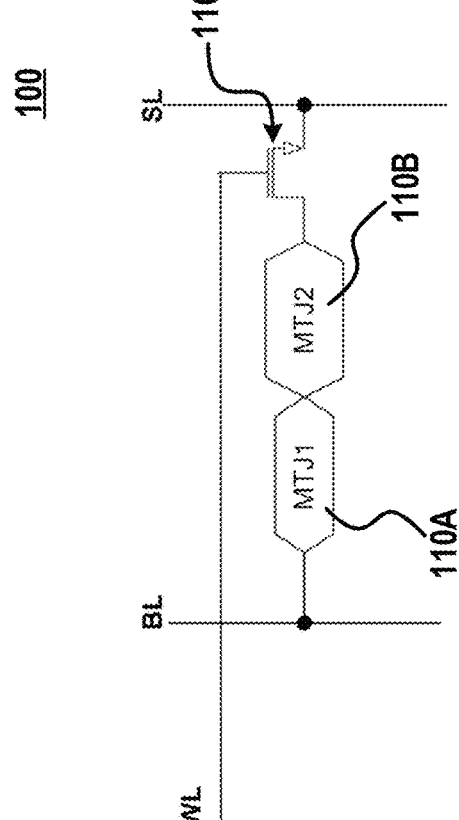
FIG. 2A is a schematic diagram showing a multi-bit MRAM cell according to aspects of the present disclosure.

FIG. 2A shows a multi-bit memory unit (referred to herein as a "multi-bit MRAM cell 100") that is operable to store a multi-bit value; in the example shown, the multi-bit MRAM cell 100 stores a multi-bit value having two bits, and includes a first MTJ device 110A that stores a most significant bit (MSB) of the multi-bit value and a second MTJ device 110B that stores a least significant bit (LSB) multi-bit value. A total resistance value of the multi-bit MRAM cell 100 correlates with the multi-bit value stored by the multi-bit MRAM cell 100. Similar to the magnetoresistive cell 20 of FIG. 1C, the multi-bit MRAM cell 100 can be in electrical communication with a "source" line SL, a "bit" line BL, and can include an access transistor 116 positioned between the second MTJ device 110B and the source line SL. As shown, the access transistor 116 includes a gate terminal that is electrically coupled to a "word" line WL to select the multi-bit MRAM cell 100 for a "read" operation. To initiate a "read" operation of the multi-bit MRAM cell 100, a reference current must $I_{ref}$ be passed through the multi-bit MRAM cell 100 to measure a total resistance value $R_{total}$ across the multi-bit MRAM cell 100, and particularly the first MTJ device 110A and the second MTJ device 110B which are connected in series as shown. The word line WL must be activated in order to enable the access transistor 116 to transmit the reference current between the source line SL and the bit line BL.

FIG. 2B shows a transfer curve for the multi-bit MRAM cell 100 of FIG. 2A. As shown, given application of a reference current across the multi-bit MRAM cell 100, the total resistance value $R_{total}$ can be read by comparison of resultant voltage values across the multi-bit MRAM cell 100 with a plurality of reference voltage values. As resistance values are naturally correlated with voltage values, FIG. 2B shows the total resistance $R_{total}$ across the multi-bit MRAM cell 100 in comparison with a first reference resistance value R_REF[0] correlated with a first reference voltage value REF[0], a second reference resistance value R_REF[1] correlated with a second reference voltage value REF[1], and a third reference resistance value R_REF[2] correlated with a third reference voltage value REF[2].

If the total resistance value $R_{total}$ is above the first reference resistance value R_REF[0], then the MSB of the multi-bit value held by the multi-bit MRAM cell 100 can be interpreted as a logic "HI" value. If the total resistance value $R_{total}$ is above the first reference resistance value R_REF[0] and also above the second reference resistance value R_REF [1], then the LSB of the multi-bit value held by the multi-bit MRAM cell 100 can be interpreted as a logic "HI" value. If the total resistance value $R_{total}$ is above the first reference resistance value R_REF[0] but below the second reference resistance value R_REF[1], then the LSB of the multi-bit value held by the multi-bit MRAM cell 100 can be interpreted as a logic "LO" value.

Similarly, if the total resistance value $R_{total}$ is below the first reference resistance value R_REF[0], then the MSB of the multi-bit value held by the multi-bit MRAM cell 100 can be interpreted as a logic "LO" value. If the total resistance value $R_{total}$ is below the first reference resistance value R_REF[0] but is above the third reference resistance value R_REF[2], then the LSB of the multi-bit value held by the multi-bit MRAM cell 100 can be interpreted as a logic "HI" value. If the total resistance value $R_{total}$ is below the first reference resistance value R_REF[0] and also below the third reference resistance value R_REF[2], then the LSB of the multi-bit value held by the multi-bit MRAM cell 100 can be interpreted as a logic "LO" value.

Figure 2D:
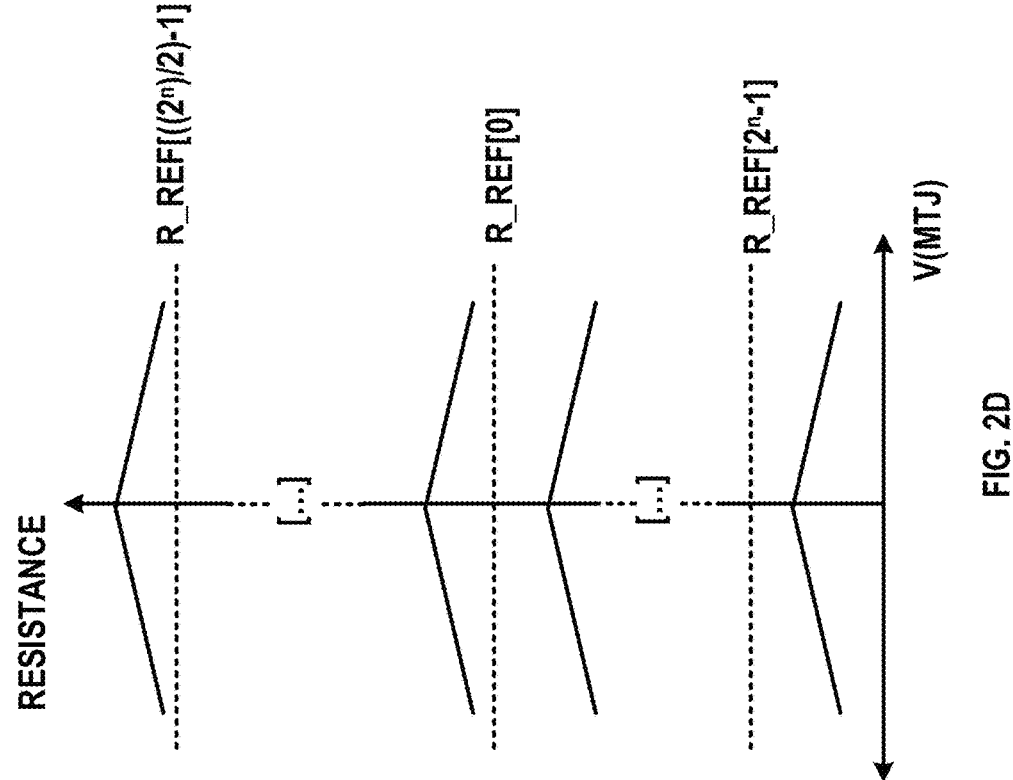
FIG. 2D is a graphical representation showing a transfer curve of the multi-bit MRAM cell FIG. 2C.
Figure 2C:
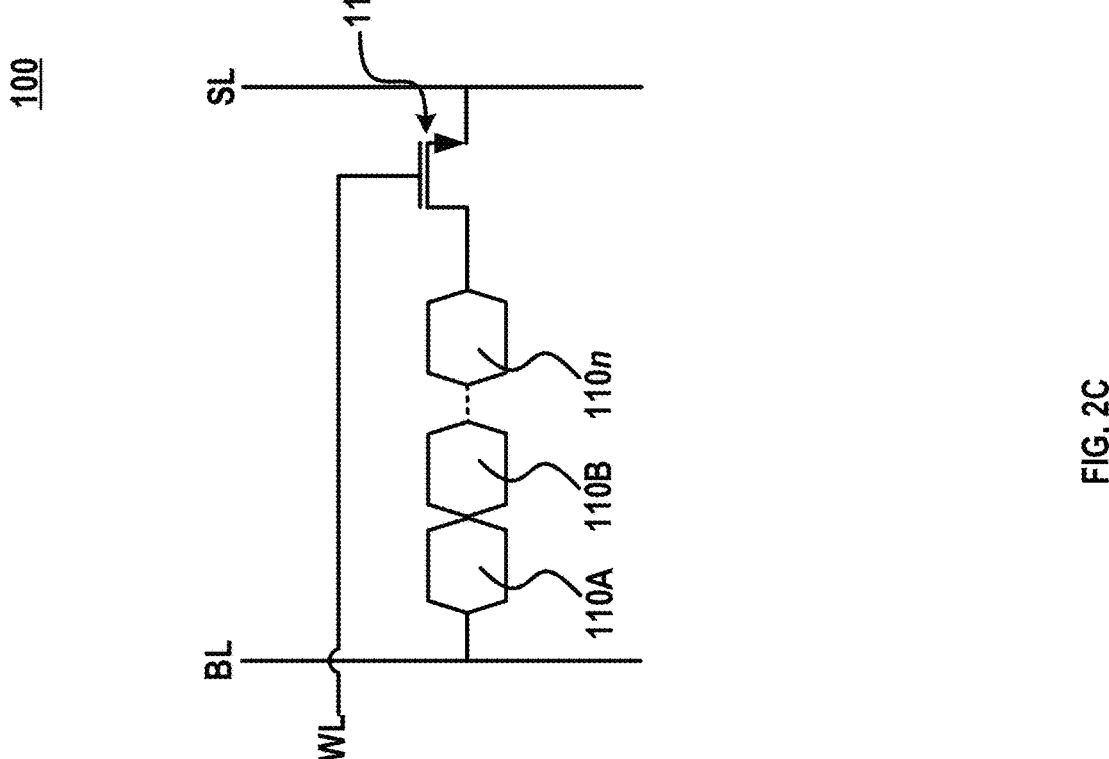
FIG. 2C is a schematic diagram showing a multi-bit MRAM cell extended to n bits.

Note that in some embodiments, as shown in FIGS. 2C and 2D, the multi-bit MRAM cell 100 can include a plurality of MTJ devices 110A-110n connected with one another in series that collectively store a multi-bit value having n bits for a total of $2^n$ possible states, requiring ($2^n-1$) distributed reference voltage values for comparison. For instance, the multi-bit MRAM cell 100 can be configured to store a multi-bit value having n=3 bits, resulting in $2^3$=8 possible states (000, 001, 010, 011, 100, 101, 110, and 111), which would require ($2^3-1$)=7 reference voltages for comparison.

Reading the Multi-Bit MRAM Cell

Figure 3A:
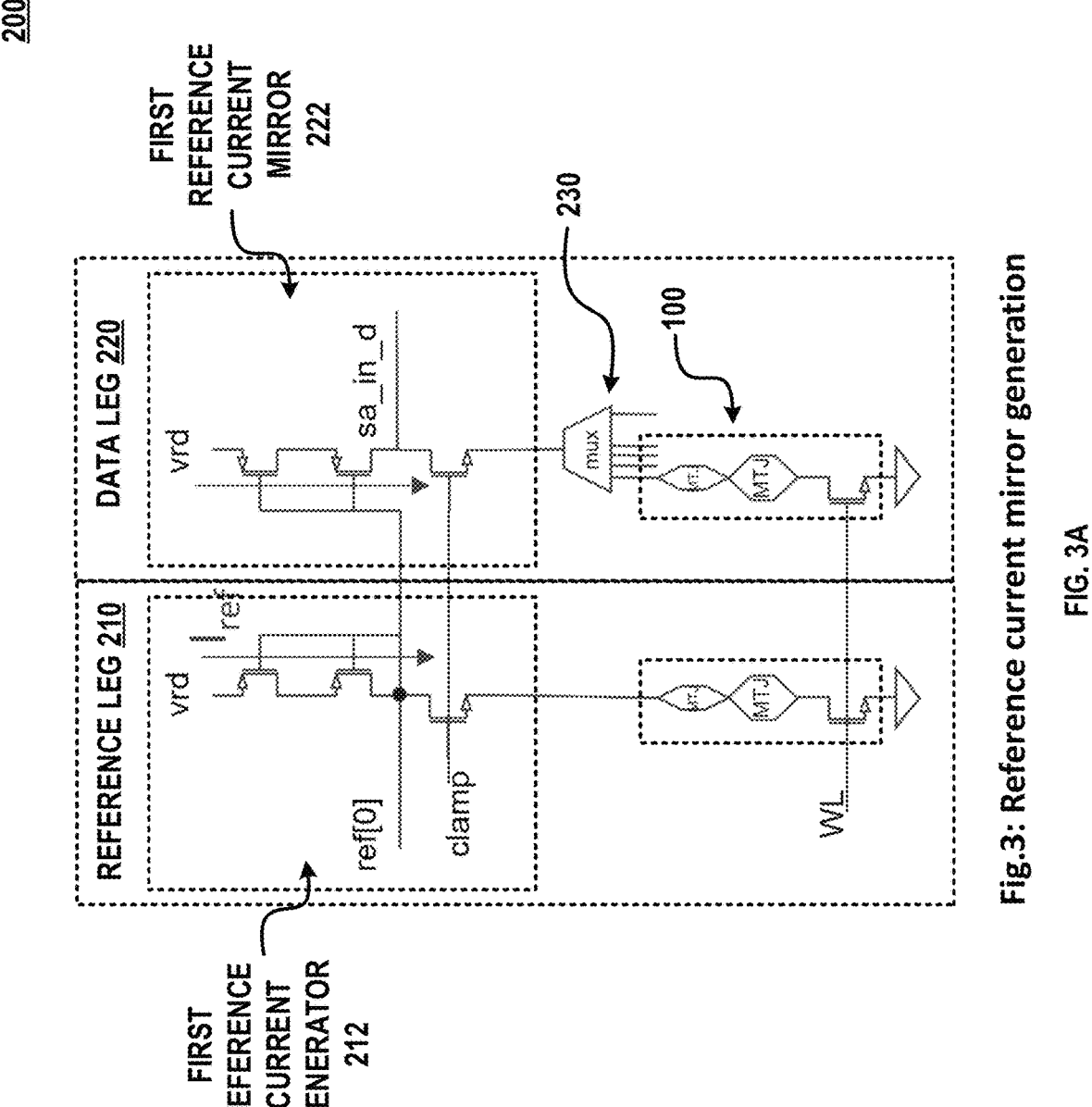
FIG. 3A is a schematic diagram showing a simplified read circuit for reading the multi-bit MRAM cell of FIG. 2C.

With reference to FIG. 3A, a simplified diagram shows a read circuit 200 for applying a reference current to read the logic values stored in the multi-bit MRAM cell 100; the read circuit 200 includes a reference leg 210 that generates a reference current Let and a data leg 220 that applies the reference current Let to the multi-bit MRAM cell 100 to read an output voltage line sa_in_d indicative of a voltage across the multi-bit MRAM cell 100.

The output voltage line sa_in_d correlates directly with the total resistance value $R_{total}$ across the multi-bit MRAM cell 100 and thus also correlates with the multi-bit value held by the multi-bit MRAM cell 100. As such, if the output voltage line sa_in_d is above the first reference voltage REF[0], then the MSB of the multi-bit value held by the multi-bit MRAM cell 100 is a logic "HI" value. If the output voltage line sa_in_d is above the first reference voltage REF[0] and also above the second reference voltage REF[1], then the MSB is a logic "HI" value and the LSB of the multi-bit value held by the multi-bit MRAM cell 100 is also a logic "HI" value such that the value stored by the multi-bit MRAM cell 100 is "11". Conversely, if the output voltage line sa_in_d is above the first reference voltage REF[0] but is below the second reference voltage REF[1], then the MSB is a logic "HI" value and the LSB is a logic "LO" value such that the value stored by the multi-bit MRAM cell 100 is "10". If the output voltage line sa_in_d is below the first reference voltage REF[0] but is above the third reference voltage REF[2], then the MSB is a logic "LO" value and the LSB is a logic "HI" value such that the value stored by the multi-bit MRAM cell 100 is "01"; finally, if the output voltage line sa_in_d is below the first reference voltage REF[0] and also is below the third reference voltage REF[2], then the MSB is a logic "LO" value and the LSB is a logic "LO" value such that the value stored by the multi-bit MRAM cell 100 is "00". This is outlined in Table 1. The logic interpretation is reversible.

TABLE 1

| Reading the multi-bit value held by a Multi-Bit MRAM cell | | | |
|---|---|---|---|
| | sa_in_d > REF[1] | REF[1] > sa_in_ d > REF[0] | REF[0] > sa_in_ d > REF[2] | sa_in_d < REF[1] |
| Value | 11 | 10 | 01 | 00 |

The example of FIG. 3A is shown with reference to the first reference voltage REF[0]; a further example is shown in a later section with respect to FIG. 4 that provides details on generation of the first reference voltage REF[0], the second reference voltage REF[1], and the third reference voltage REF[2].

The reference leg 210 includes a first reference current generator network 212 that generates the reference current $I_{ref}$. The data leg 220 includes a first reference current mirror network 222 that mirrors the reference current $I_{ref}$ generated by the reference leg 210; the output voltage line sa_in_d is resultant of the reference current $I_{ref}$ being applied across the multi-bit MRAM cell 100 and is directly correlated with the total resistance value $R_{total}$ for comparison of the total resistance value $R_{total}$ with the first reference resistance value R_REF[0]. The multi-bit MRAM cell 100 is selected for reading by an associated multiplexor 230.

MSB and LSB Sensing

Figures 3B, 3C:
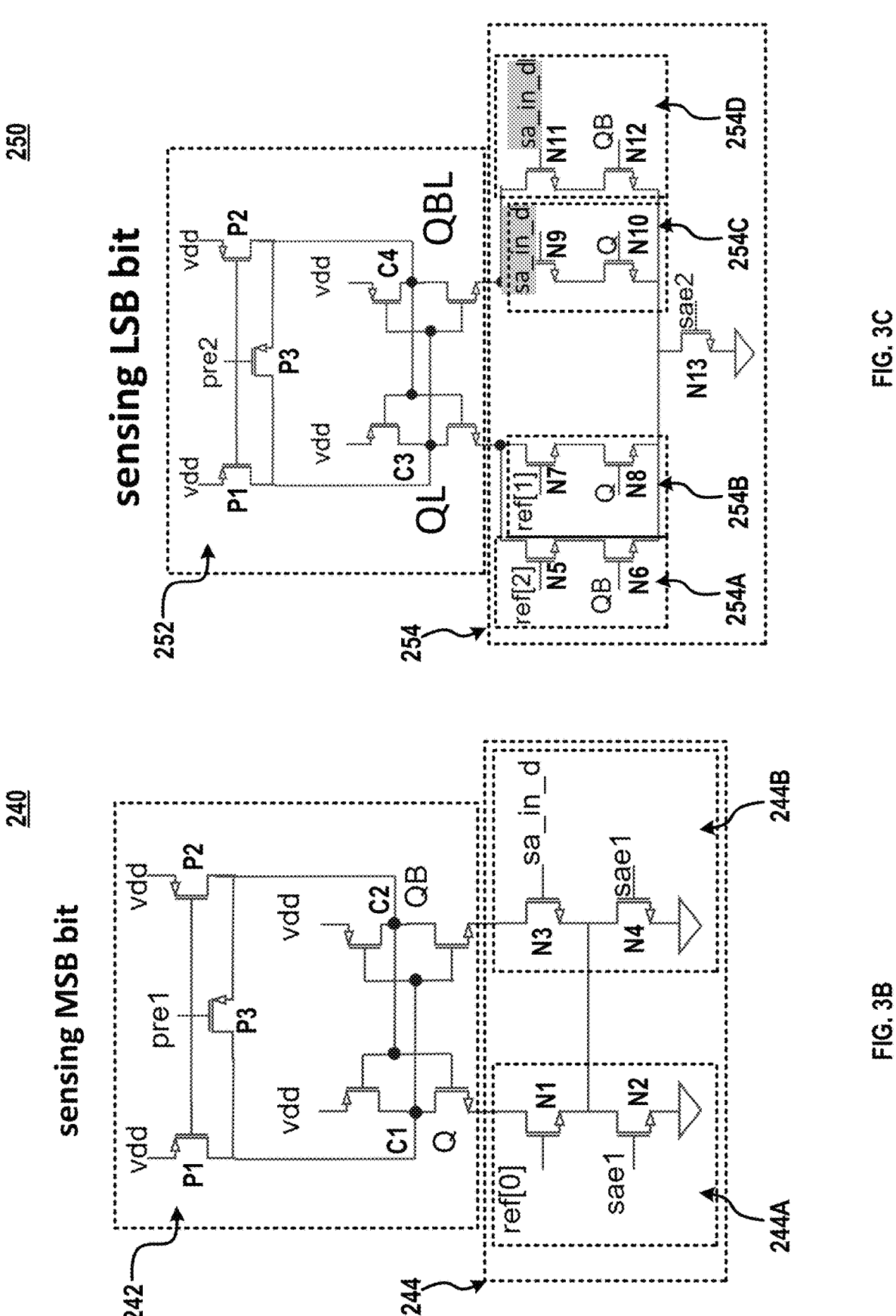
FIGS. 3B and 3C are a pair of schematic diagrams respectively showing a first read circuit for reading a most-significant bit (MSB) of the multi-bit MRAM cell of FIG. 2A and a second read circuit for reading a least-significant bit (LSB) of the multi-bit MRAM cell of FIG. 2A.

With reference to FIG. 3B, the read circuit 200 includes an MSB sensing circuit 240 that enables reading of the MSB of the multi-bit value stored in the multi-bit MRAM cell 100 of FIG. 2A. The MSB sensing circuit 240 can be a differential sensing amplifier and can include a pull-up transistor network 242 including a first p-channel transistor P1, a second p-channel transistor P2 and a third p-channel transistor P3 whose gates are connected to a first precharge line PRE1. As shown, a first source terminal of the first p-channel transistor P1 and a second source terminal of the second p-channel transistor P2 are connected to a positive voltage source VDD, with the third p-channel transistor P3 connected between a first drain terminal of the first p-channel transistor P1 and a second drain terminal of the second p-channel transistor P2. The first drain terminal of the first p-channel transistor P1 is connected to a first CMOS pairing C1 associated with a first output voltage line Q and the second drain terminal of the second p-channel transistor P2 is connected to a second CMOS pairing C2 associated with a second output voltage line QB.

The MSB sensing circuit 240 includes a lower network 244, where a first leg 244A of the lower network 244 includes a first n-channel transistor N1 whose gate is tied to the first reference voltage value REF[0] and a second n-channel transistor N2 whose gate is tied to a first read activation line sae1. Note that the first output voltage line Q is associated with the first reference voltage value REF[0]. Similarly, the lower network 244 includes a second leg 244B that includes a third n-channel transistor N3 whose gate is tied to the first reference voltage value REF[0] and a second n-channel transistor N4 whose gate is tied to the output voltage line sa_in_d resultant of the reference current $I_{ref}$ being applied across the multi-bit MRAM cell 100.

As such, the MSB sensing circuit 240 compares the first reference voltage value REF[0] with a voltage value of output voltage line sa_in_d. If the first reference voltage value REF[0] is greater than the output voltage line sa_in_d, then the first output voltage line Q is down to a logic "LO", indicating that the MSB of the of the multi-bit value held by the multi-bit MRAM cell 100 is a logic "LO" value. If the first reference voltage value REF[0] is smaller than the output voltage line sa_in_d, then the first output voltage line Q is pulled up to a logic "HI", indicating that the MSB of the multi-bit MRAM cell 100 is a logic "HI" value.

With reference to FIG. 3C, the read circuit 200 includes a LSB sensing circuit 250 that enables reading of the LSB of the multi-bit value stored in the multi-bit MRAM cell 100 of FIG. 2A. Similar to the MSB sensing circuit of FIG. 3B, the LSB sensing circuit 250 can be a differential sensing amplifier and can include a pull-up transistor network 252 including a fourth p-channel transistor P4, a fifth p-channel transistor P5 and a sixth p-channel transistor P6 whose gates are connected to a second precharge line PRE2. As shown, a fourth source terminal of the fourth p-channel transistor P4 and a fifth source terminal of the fifth p-channel transistor P5 are connected to a positive voltage source VDD, with the sixth p-channel transistor P6 connected between a fourth drain terminal of the fourth p-channel transistor P4 and a fifth drain terminal of the fifth p-channel transistor P5. The fourth drain terminal of the fourth p-channel transistor P4 is connected to a third CMOS pairing C3 associated with a fourth output voltage line QL and the fifth drain terminal of the fifth p-channel transistor P5 is connected to a fourth CMOS pairing C4 associated with a fourth output voltage line QBL.

The LSB sensing circuit 250 includes a lower network 254; the lower network 254 can include a first leg 254A associated with the third reference voltage value REF[2], a second leg 254B associated with the second reference voltage value REF[1], a third leg 254C associated with the output voltage line sa_in_d, and a fourth leg 254D also associated with the output voltage line sa_in_d; the output voltage line sa_in_d is resultant of the reference current $I_{ref}$ being applied across the multi-bit MRAM cell 100.

The first leg 254A of the lower network 254 includes a fifth n-channel transistor N5 whose gate is tied to the third reference voltage value REF[2] and a sixth n-channel transistor N6 whose gate is tied to the second output voltage line QB from the MSB sensing circuit 240. Similarly, the second leg 254B of the lower network 254 includes a seventh n-channel transistor N7 whose gate is tied to the second reference voltage value REF[1] and an eighth n-channel transistor N8 whose gate is tied to the first output voltage line Q from the MSB sensing circuit 240. Note that the first leg 254A and the second leg 254B are both associated with the fourth output voltage line QL.

The third leg 254C of the lower network 244 includes a ninth n-channel transistor N9 whose gate is tied to the output voltage line sa_in_d resultant of the reference current $I_{ref}$ being applied across the multi-bit MRAM cell 100, and a tenth n-channel transistor N10 whose gate is tied to the first output voltage line Q from the MSB sensing circuit 240. Similarly, the fourth leg 254D of the lower network 244 includes an eleventh n-channel transistor N11 whose gate is tied to the output voltage line sa_in_d resultant of the reference current $I_{ref}$ being applied across the multi-bit MRAM cell 100 and a twelfth n-channel transistor N12 whose gate is tied to the second output voltage line QB from the MSB sensing circuit 240.

The first leg 254A, the second leg 254B, the third leg 254C and the fourth leg 254D are all associated with a thirteenth n-channel transistor N13 whose gate is tied to a second read activation line sae2.

As such, the LSB sensing circuit 250 compares the second reference voltage value REF[1] and the third reference voltage value REF[2] with the voltage value of the output voltage line sa_in_d, and depends on the comparison result from the MSB sensing circuit 240 in order to enable two of the first leg 254A, the second leg 254B, the third leg 254C and the fourth leg 254D. If the first output voltage line Q from the MSB sensing circuit 240 is a logic "HI" and the second output voltage line QB from the MSB sensing circuit 240 is a logic "LO" (indicating that the MSB of the multi-bit MRAM cell 100 is a logic "HI" value), then only the second leg 254B and the third leg 254C are activated to compare the voltage value of the output voltage line sa_in_d with the second reference voltage value REF[1]. Conversely, if the first output voltage line Q from the MSB sensing circuit 240 is a logic "LO" and the second output voltage line QB from the MSB sensing circuit 240 is a logic "HI" (indicating that the MSB of the multi-bit MRAM cell 100 is a logic "LO" value), then only the first leg 254A and the fourth leg 254D are activated to compare the voltage value of the output voltage line sa_in_d with the third reference voltage value REF[2].

If the second leg 254B and the third leg 254C are activated to compare the voltage value of the output voltage line sa_in_d with the second reference voltage value REF [1], and the output voltage line sa_in_d is greater than the second reference voltage value REF[1], then QL is pulled up to a logic "HI", indicating that the LSB of the multi-bit MRAM cell 100 is a logic "HI" value. If the output voltage line sa_in_d is lower than the second reference voltage value REF[1], then QL is pulled down to a logic "LO", indicating that the LSB of the multi-bit MRAM cell 100 is a logic "LO" value.

If the first leg 254A and the fourth leg 254D are activated to compare the voltage value of the output voltage line sa_in_d with the third reference voltage value REF[2], and the output voltage line sa_in_d is greater than the third reference voltage value REF[2], then QL is pulled up to a logic "HI", indicating that the LSB of the multi-bit MRAM cell 100 is a logic "HI" value. If the output voltage line sa_in_d is lower than third reference voltage value REF[2], then QL is pulled down to a logic "LO", indicating that the LSB of the multi-bit MRAM cell 100 is a logic "LO" value.

Read Sequence and Resultant Behavior

Figure 3D:
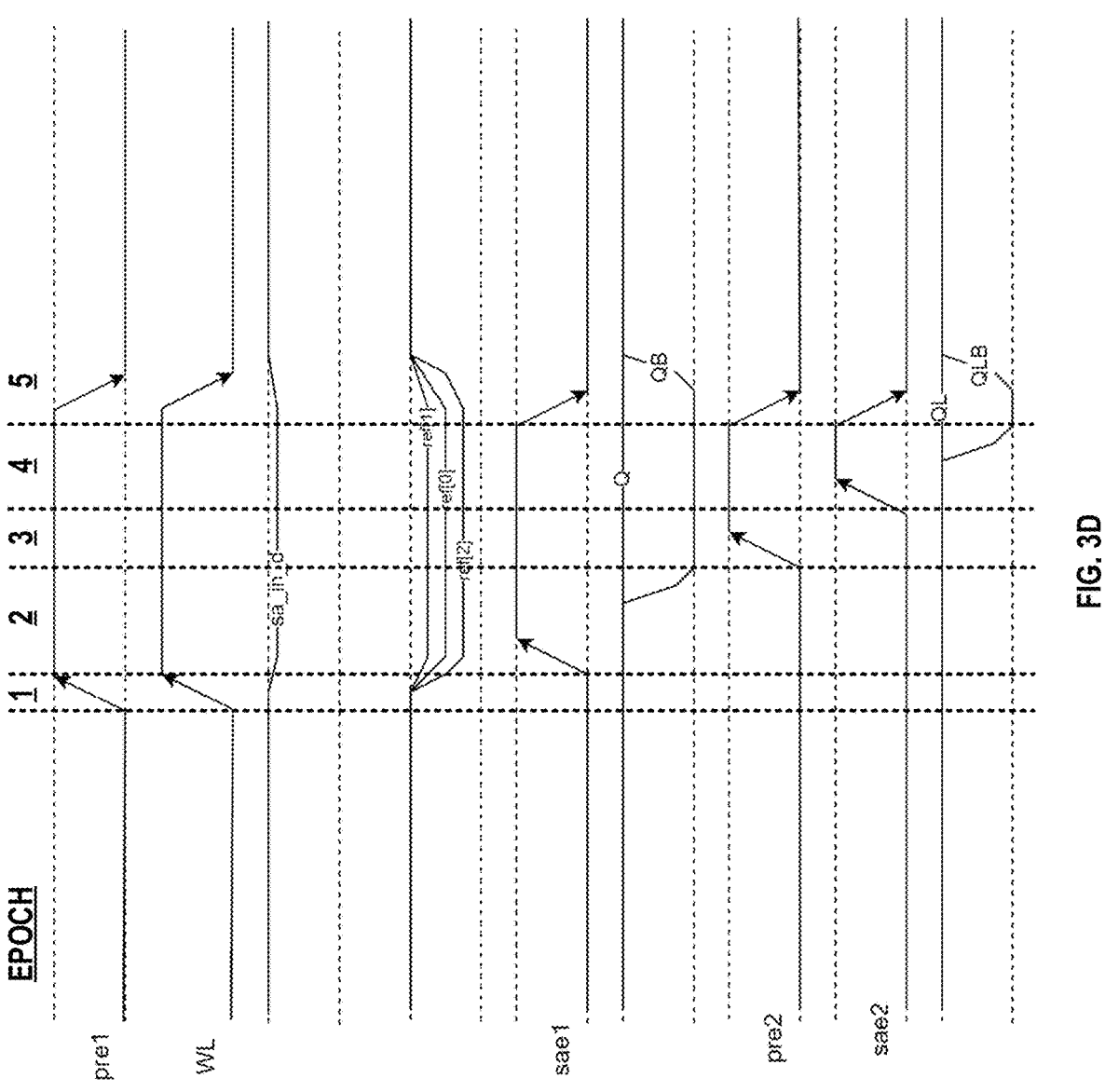
FIG. 3D is a graphical representation showing behavior of the first read circuit and the second read circuit for reading the multi-bit MRAM cell of FIG. 2A during a read cycle.

With additional reference to FIG. 3D, a read operation cycle is shown for reading the multi-bit value stored within the multi-bit MRAM cell 100 using the first output voltage Q (associated with the MSB of the multi-bit value held by the multi-bit MRAM cell 100) and the second output voltage QL (associated with the LSB of the multi-bit value held by the multi-bit MRAM cell 100). The "read" operation cycle can be divided into five epochs and is controlled through the following inputs: the first precharge line PRE1 associated with the MSB, the second precharge line PRE2 associated with the LSB, the word line that enables reading of the multi-bit MRAM cell 100, the first read activation line sae1 associated with the MSB, and the second read activation line sae2 associated with the LSB. Incidental values that affect the outcome include the reference voltage lines REF[0], REF[1], and REF[2], and the output voltage line sa_in_d indicative of the output voltage across the multi-bit MRAM cell 100 resultant of the reference current $I_{ref}$ applied across.

Outputs include the first output voltage Q (associated with the MSB of the multi-bit MRAM cell 100), the second output voltage QB (associated with the MSB of the multi-bit MRAM cell 100), the third output voltage QL (associated with the LSB of the multi-bit MRAM cell 100), the fourth output voltage QLB (associated with the LSB of the multi-bit MRAM cell 100).

For this example, the value of the multi-bit MRAM cell 100 is "11"; as such, the output voltage line sa_in_d is above the second reference voltage REF[1].

During Epoch 1, the first precharge line PRE1 and the word line WL are each activated to prepare the MSB sensing circuit 240 for reading of the MSB of the multi-bit MRAM cell 100; as a result, the reference voltage lines REF[0], REF[1], and REF[2] start to fall towards their correct values, and the output voltage line sa_in_d indicative of the output voltage across the multi-bit MRAM cell 100 resultant of the reference current $I_{ref}$ applied across falls very slightly, but not enough to pull the output voltage line sa_in_d lower than the second reference voltage REF[1].

During Epoch 2, the first read activation line sae1 associated with the MSB is activated, while the first precharge line PRE1 and the word line WL remain active. This causes the reference voltage lines REF[0], REF[1], and REF[2] to reach their correct values and opens a path from the pull-up transistor network 242 of the MSB sensing circuit 240 towards a ground line. For this example, the MSB of the multi-bit MRAM cell 100 is a "1" and the value of the output voltage line sa_in_d is above the value of the first reference voltage line REF[0]; as such, the first output voltage Q (associated with the MSB of the multi-bit MRAM cell 100) remains "HI" and the second output voltage QB is pulled "LO", indicating that the MSB of the multi-bit MRAM cell 100 is "HI".

During Epoch 3, once the first output voltage Q and the second output voltage QB are settled, the second precharge line PRE2 is activated to prepare the LSB sensing circuit 250 for reading of the LSB of the multi-bit MRAM cell 100, while the first precharge line PRE1, the first read activation line sae1, and the word line WL remain active.

During Epoch 4, the second read activation line sae2 associated with the LSB is activated, while the first precharge line PRE1, the second precharge line PRE2, the first read activation line sae1, and the word line WL remain active. This opens a path from the pull-up transistor network 242 of the LSB sensing circuit 250 towards a ground line. For this example, the LSB of the multi-bit MRAM cell 100 is a "1" and the value of the output voltage line sa_in_d is above the value of the second reference voltage line REF[1]; as such, by the end of Epoch 4, the first output voltage QL (associated with the LSB of the multi-bit MRAM cell 100) remains "HI" and the second output voltage QLB is pulled "LO", indicating that the LSB of the multi-bit MRAM cell 100 is also "HI".

During Epoch 5, the first precharge line PRE1, the second precharge line PRE2, the first read activation line sae1, the second read activation line sae2 and the word line WL are all deactivated, allowing all resultant values to return to default.

Reference Voltage Generation

Figure 4:
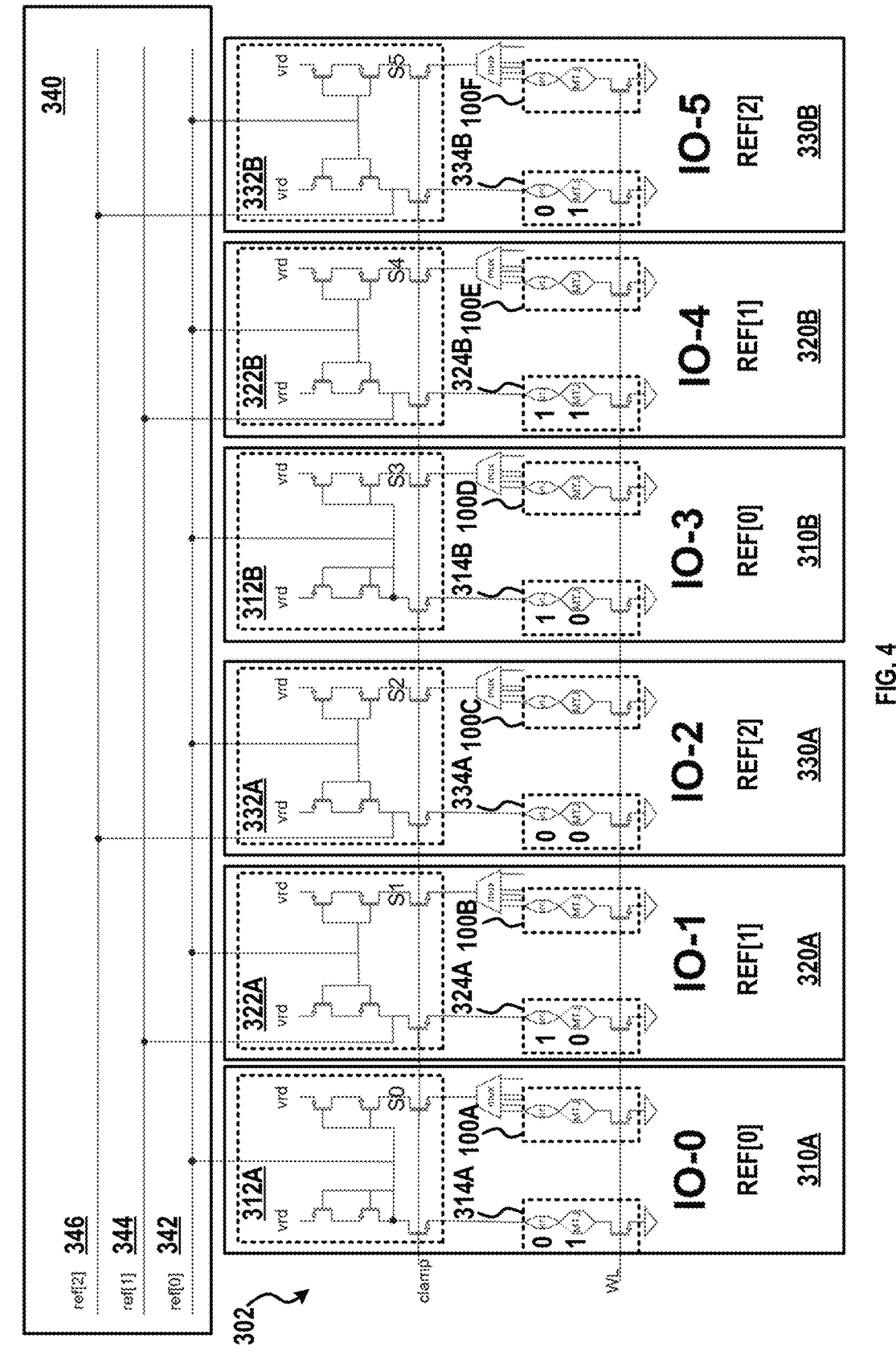
FIG. 4 is a schematic diagram showing reference current generation that enable reading of the multi-bit MRAM cell of FIG. 2A.

With reference to FIG. 4, a reference voltage generation circuit 300 is shown that generates the reference voltages needed for comparison with the multi-bit MRAM cell 100. The example provided herein is applicable to a multi-bit MRAM cell 100 that stores two bits that result in four states (00, 01, 10 and 11) and thus generates the first reference voltage value REF[0], the second reference voltage value REF[1], and the third reference voltage value REF[2], however note that the reference voltage generation circuit 300 can be configured to be applicable to a multi-bit MRAM cell that stores any number of bits and can generate more than three reference voltages. For a multi-bit MRAM cell having n bits and storing $2^n$ possible states, a corresponding reference voltage generation circuit will generate $2^n-1$ reference voltages. Nodes labeled S0 . . . S5 in FIG. 4 can be considered analogous to the output voltage line sa_in_d described above; also note that in FIG. 4, multi-bit MRAM cells 100A-100F shown in the data legs can each hold different data values for reading. The S0 . . . S5 nodes reflect the reference current Let and force the reference current Let through data-storing multi-bit MRAM cells 100A-100F. Based on selections at the multiplexor, the reference current Let flows through the data-storing multi-bit MRAM cells 100A-100F to generate sa_in_d.

As shown, the reference voltage generation circuit 300 includes a plurality of generator legs 302 that are paired according to their associated reference voltage, including a first REF[0] generator leg 310A, a second REF[0] generator leg 310B, a first REF[1] generator leg 320A, a second REF[1] generator leg 320B, a first REF[2] generator leg 330A and a second REF[2] generator leg 330B. The reference voltage generation circuit 300 also includes an output line bank 340 that includes an REF[0] output line 342, a REF[1] output line 344 and a REF[2] output line 346. Note that while FIG. 4 shows six total generator legs 310A, 310B, 320A, 320B, 330A and 330B, any quantity of generator legs can be used to generate the reference voltages REF[0], REF[1], REF[2] . . . REF[$2^n-1$]. Voltage values held by reference voltages REF[0], REF[1], REF[2] REF[$2^n-1$] can be modified by selectively combining associated generator legs having different fixed-value multi-bit MRAM cells to modify an overall "average" voltage value.

The first REF[0] generator leg 310A and the second REF[0] generator leg 310B are collectively configured to generate the first reference voltage value REF[0] and can be configured as shown in FIG. 3A. As shown, the first REF[0] generator leg 310A includes a first REF[0] pull-up transistor network 312A that generates the reference current Let for application to a first REF[0] reference leg and a first REF[0] data leg. As shown, the first REF[0] reference leg includes a first fixed-value REF[0] MRAM cell 314A that stores a "01" value. Similarly, the second REF[0] generator leg 310B includes a second REF[0] pull-up transistor network 312B that generates the reference current Let for application to a second REF[0] reference leg and a second REF[0] data leg. As shown, the second REF[0] reference leg includes a second fixed-value REF[0] MRAM cell 314B that stores a "10" value. For generation of the REF[0] line, the gates of transistors within the first REF[0] pull-up transistor network 312A and the second REF[0] pull-up transistor network 312B are each connected to the REF[0] output line 342 and an output of the first REF[0] pull-up transistor network 312A and an output of the second REF[0] pull-up transistor network 312B are each connected to the REF[0] line 342.

The first REF[0] generator leg 310A and the second REF[0] generator leg 310B are both connected to the REF[0] output line 342 that reflects an "average" voltage indicative of an "average" resistance across the first fixed-value REF[0] MRAM cell 314A that stores a "01" value and the second fixed-value REF[0] MRAM cell 314B that stores a "10" value. The reference current Let is generated from the first REF[0] pull-up transistor network 312A and the second REF[0] pull-up transistor network 312B. The first fixed-value REF[0] MRAM cell 314A and the second fixed-value REF[0] MRAM cell 314B collectively contribute to a fixed "reference" resistance exhibited by first REF[0] generator leg 310A and the second REF[0] generator leg 310B that is reflected in the reference voltage value exhibited by the REF[0] output line 342. Further, as discussed above, to modify the value held by the REF[0] output line 342, any number of generator legs having any suitable combination of stored values stored by associated fixed-value REF[0] MRAM cells can be selectively combined to modify the "average" resistance associated with the fixed-value REF[0] MRAM cells, thus reflecting a modified "average" voltage. This concept can be extended to adjust the value of any reference voltage.

Similarly, the first REF[1] generator leg 320A and the second REF[1] generator leg 320B are collectively configured to generate the second reference voltage value REF[1]. As shown, the first REF[1] generator leg 320A includes a first REF[1] pull-up transistor network 322A that mirrors the reference current Let for application to a first REF[1] reference leg and a first REF[1] data leg. As shown, the first REF[1] reference leg includes a first fixed-value REF[1] MRAM cell 324A that stores a "10" value. Similarly, the second REF[1] generator leg 320B includes a second REF [1] pull-up transistor network 322B that mirrors the reference current Let for application to a second REF[1] reference leg and a second REF[1] data leg. As shown, the second REF[1] reference leg includes a second fixed-value REF[1] MRAM cell 3 that stores a "11" value. For generation of the REF[1] line, the gates of transistors within the first REF[1] pull-up transistor network 322A and the second REF[1] pull-up transistor network 322B are each connected to the REF[0] output line 342, however an output of the first REF[1] pull-up transistor network 322A and an output of the second REF[1] pull-up transistor network 322B are each connected to the REF[1] line 344.

The first REF[1] generator leg 320A and the second REF[1] generator leg 320B are both connected to the REF[1] output line 344 that reflects an "average" voltage indicative of an "average" resistance across the first fixed-value REF[1] MRAM cell 324A that stores a "10" value and the second fixed-value REF[1] MRAM cell 324B that stores a "11" value such that the value of the REF[1] output line 344 is greater than the value of the REF[0] output line 342. The reference current Let is mirrored in all other legs including the first REF[1] pull-up transistor network 322A and the second REF[1] pull-up transistor network 322B for REF[1].

Similarly, the first REF[2] generator leg 330A and the second REF[2] generator leg 330B are collectively configured to generate the second reference voltage value REF[2]. As shown, the first REF[2] generator leg 330A includes a first REF[2] pull-up transistor network 332A that mirrors the reference current $I_{ref}$ for application to a first REF[2] reference leg and a first REF[2] data leg. As shown, the first REF[2] reference leg includes a first fixed-value REF[2] MRAM cell 334A that stores a "00" value. Similarly, the second REF[2] generator leg 330B includes a second REF [2] pull-up transistor network 332B that mirrors the reference current $I_{ref}$ for application to a second REF[2] reference leg and a second REF[2] data leg. As shown, the second REF[2] reference leg includes a second fixed-value REF[2] MRAM cell 334B that stores a "01" value. For generation of the REF[2] line, the gates of transistors within the first REF[2] pull-up transistor network 332A and the second REF[2] pull-up transistor network 332B are each connected to the REF[0] output line 342, however an output of the first REF[2] pull-up transistor network 332A and an output of the second REF[2] pull-up transistor network 332B are each connected to the REF[2] line 346.

The first REF[2] generator leg 330A and the second REF[2] generator leg 330B are both connected to the REF[2] output line 346 that reflects an "average" voltage indicative of an "average" resistance across the first fixed-value REF[2] MRAM cell 334A that stores a "00" value and the second fixed-value REF[2] MRAM cell 334B that stores a "01" value such that the value of the REF[2] output line 346 is greater than the value of the REF[0] output line 342. The reference current $I_{ref}$ is mirrored in all other legs including the first REF[2] pull-up transistor network 332A and the second REF[2] pull-up transistor network 332B for REF[2].

Table 2 shows an example configuration of fixed-value MRAM cell values that generate reference voltage values of corresponding reference voltage output lines.

TABLE 2

| | Example reference voltage generation with fixed reference cell values | | |
| --- | --- | --- | --- |
| | REF[0] | REF[1] | REF[2] |
| First fixed-value cell | 01 | 10 | 00 |
| Second fixed-value cell | 10 | 11 | 01 |

Methods

FIG. 5 shows a method 400 for reading a multi-bit value stored within a multi-bit memory unit (e.g., multi-bit MRAM cell 100 shown with reference to FIGS. 2A-2D).

Method 400 starts at block 410 which includes generating, at a reference voltage generation circuit in communication with a multi-bit memory unit storing a multi-bit value, $(2^n-1)$ reference voltage values REF[0]-REF$[2^n-1]$, wherein the $(2^n-1)$ reference voltage values REF[0]-REF$[2^n-1]$ are each correlated with $(2^n-1)$ distributed reference resistance values R_REF[0]-R_REF$[2^n-1]$ for comparison with a total resistance value across the multi-bit memory unit. Block 420 includes applying a reference current across the multi-bit memory unit having n MTJ devices connected in series with one another, wherein each MTJ device of the n MTJ devices of the multi-bit memory unit is operable to store a logic bit of the multi-bit value, wherein a total resistance value of the multi-bit memory unit correlates with the multi-bit value stored by the multi-bit memory unit. Block 430 includes measuring, at a sensing amplifier in communication with the multi-bit memory unit, an output voltage value associated with the multi-bit memory unit. Block 440 includes comparing the resultant output voltage value associated with the multi-bit memory unit with the $(2^n-1)$ reference voltage values REF[0]-REF$[2^n-1]$ to determine the multi-bit value stored by the multi-bit memory unit.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

The invention claimed is:

1. A circuit, comprising:
   a reference voltage generation circuit having a plurality of generator legs that concurrently generate first, second, and third reference voltages on respective first, second, and third reference lines;
   a more significant bit (MSB) stage of a sensing amplifier that, during a clock cycle of a read operation, generates a first complementary output and a second complementary output encoding an MSB result of comparing a voltage across a multi-bit memory unit with the first reference voltage; and
   a less significant bit (LSB) stage of the sensing amplifier that, during the same clock cycle of the read operation, generates an output encoding an LSB result of comparing the voltage across the multi-bit memory unit with one of the second or third reference voltages, the LSB stage including:
      a first coupling path between the sensing amplifier and the second reference line gated by the first complementary output of the MSB stage; and a second coupling path between the sensing amplifier and the third reference line gated by the second complementary output of the MSB stage.

2. The circuit of claim 1, each respective generator leg including:
   a first fixed-value magnetic tunnel junction device having a first terminal in electrical communication with a bit line and having a second terminal defined opposite to the first terminal; and
   a second fixed-value magnetic tunnel junction device connected with the first fixed-value magnetic tunnel junction device in series, the second fixed-value magnetic tunnel junction device having a first terminal in electrical communication with the second terminal of the first fixed-value magnetic tunnel junction device and having a second terminal defined opposite to the first terminal;
   wherein the first fixed-value magnetic tunnel junction device and the second fixed-value magnetic tunnel junction device contribute to a fixed reference resistance that correlates with a reference voltage of the generator leg.

3. The circuit of claim 1, wherein a total resistance value of the multi-bit memory unit correlates with a multi-bit value stored by the multi-bit memory unit.

4. The circuit of claim 3, wherein the sensing amplifier compares the output voltage associated with the multi-bit memory unit with the plurality of reference voltages generated by the reference voltage generation circuit to determine the total resistance value of the multi-bit memory unit.

5. The circuit of claim 3, wherein the multi-bit value stored by the multi-bit memory unit includes n bits and wherein the reference voltage generation circuit generates $2^2-1$ reference voltages.

6. The circuit of claim 1, wherein each generator leg of the plurality of generator legs includes a pull-up transistor network in electrical communication with a positive supply node, the pull-up transistor network including a pull-up transistor having a gate terminal in electrical communication with a corresponding one of the first, second, and third reference lines.

7. The circuit of claim 6, wherein a drain terminal of the pull-up transistor of the pull-up transistor network is in electrical communication with the corresponding one of the first, second, and third reference lines.

8. The circuit of claim 1, wherein selective combination of two or more generator legs of the plurality of generator legs results in modification of an average voltage of a reference voltage.

9. The circuit of claim 1, wherein the first reference voltage is equal to an average of voltages generated by a first generator leg having a fixed-value multi-bit memory unit storing 01 and a second generator leg having a fixed-value multi-bit memory unit storing 10.

10. The circuit of claim 1, wherein the second reference voltage is equal to an average of voltages generated by a third generator leg having a fixed-value multi-bit memory unit storing 10 and a fourth generator leg having a fixed-value multi-bit memory unit storing 11.

11. The circuit of claim 1, wherein the third reference voltage is equal to an average of voltages generated by a fifth generator leg having a fixed-value multi-bit memory unit storing 00 and a sixth generator leg having a fixed-value multi-bit memory unit storing 01.

* * * * *